United States Patent [19]

Dixon

[11] 4,195,695
[45] Apr. 1, 1980

[54] LAND IMPRINTER

[75] Inventor: Robert M. Dixon, Tucson, Ariz.

[73] Assignee: The United States of America as represented by the Secretary of Agriculture, Washington, D.C.

[21] Appl. No.: 866,079

[22] Filed: Dec. 30, 1977

[51] Int. Cl.² .................................... A01B 29/04
[52] U.S. Cl. .................................... 172/1; 172/185; 172/554
[58] Field of Search ............. 172/539, 554, 21, 548; 301/43; 404/124, 121

[56] References Cited

U.S. PATENT DOCUMENTS

| 419,892 | 1/1890 | Schumacher | 172/554 |
|---|---|---|---|
| 460,012 | 9/1891 | Hammett | 172/540 |
| 953,546 | 3/1910 | Pennington | 172/540 |
| 1,069,264 | 8/1913 | Keller | 172/548 |
| 1,284,385 | 11/1918 | Linden | 301/43 |
| 1,403,195 | 1/1922 | Rapattoni | 404/121 |
| 2,146,222 | 2/1939 | Pace | 172/539 |
| 2,228,265 | 1/1941 | Garey | 172/539 |
| 2,228,389 | 1/1941 | Garey | 172/548 |
| 3,071,050 | 1/1963 | Shatto | 172/554 X |
| 3,463,063 | 8/1969 | Caron | 404/124 |
| 3,922,106 | 11/1975 | Caron | 404/121 |

FOREIGN PATENT DOCUMENTS

| 865491 | 3/1971 | Canada | 404/121 |
|---|---|---|---|
| 380728 | 9/1923 | Fed. Rep. of Germany | 172/548 |

*Primary Examiner*—Richard J. Johnson
*Attorney, Agent, or Firm*—M. Howard Silverstein; David G. McConnell; Theodore J. Leitereg

[57] ABSTRACT

A method and apparatus for treatment of land surfaces is disclosed. The land surface is imprinted by means of imprint capsules of alternating geometries—one being a water-runoff-directing geometry; the other, a water-infiltration-enhancing geometry. The method prevents water runoff and enhances water infiltration into the soil in areas where high moisture levels would be desirable, such as in seed beds and at the base of growing plants.

9 Claims, 10 Drawing Figures

4,195,695

LAND IMPRINTER

BACKGROUND OF THE INVENTION

1. Field of the Invention

This invention relates to and has among its objects treatment of land surfaces to enhance water infiltration into the soil. It is a further object of the invention to prevent water runoff and soil erosion by increasing both vegetative mulch and depression storage. Other objects of the invention will be apparent from the following description wherein parts and percentages are by weight unless otherwise specified.

2. Description of the Prior Art

Various land surface modification treatments are known. One such treatment is level bench terracing. Long, flat terraces, level in all directions, with dikes at both ends and along the front are constructed to provide a water storage capacity. A contributing or sloped area may be included within the level area. Unfortunately, level bench terracing is not always successful. Further, the method is severe and expensive.

Contour furrowing is another known land surface modification treatment. Parallel furrows are cut into the soil from 15 meters to 0.6 meters apart. This method is used less extensively than in the past due primarily to the fact that specialized equipment is required. In addition, the method is also expensive.

Range pitting is a method wherein basins or pits are formed in the soil. Generally, the basins are about 76 centimeters long, 20 centimeters wide, and 10 centimeters deep and collect water in small pools, thereby preventing runoff.

Another method for modifying land surfaces involves the formation of gully plugs. It consists of creating small dams across micro-drainages constructed with a bulldozer by pushing soil downslope. Usually, the gully plugs are about 30 to 64 square meters in area and 0.5–0.9 meters in depth.

Contour trenching has been used exclusively in mountain terrain on 30 to 70% slopes. This method consists of forming a series of zero grade in-sloping treanches with size and spacing designed to accommodate a predetermined amount of surface runoff. Trenches are about one meter or more in depth and width with intrafurrow dams constructed at about eleven meter intervals.

The above-mentioned methods possess certain disadvantages. None of the methods provides adequate sites for establishment of vegetation and for enhancing vegetative growth. All reduce the amount of vegetative mulch and produce unstable surface geometries. Furthermore, these methods are inappropriate for controlling water runoff from intense rainfall. In addition, soil erosion is increased as the result of the application of some of the above methods. Most of the methods yield unsatisfactory results in brushy, steeply-sloping, deeply-gullied, or rocky terrain. Very little control over point of water infiltration, runoff, erosion, and surface evaporation is realized.

SUMMARY OF THE INVENTION

The invention described herein provides means and apparatus for obviating the aforementioned problems. In accordance with the invention land surfaces are imprinted by means of an apparatus formed of two imprint capsules, the outer surface of each containing a different geometry—one being a water-infiltration-enhancing geometry, and the other, a water-runoff-directing geometry adjacent thereto. By means of the method of the invention water is collected on the soil imprinted with the water-runoff-directing geometry and directed to the area imprinted with a water-infiltration-enhancing geometry whereat it can contribute to maximum seed germination, seedling establishment and vegetative growth.

One of the advantages of the invention is that better control of the point of infiltration and collection of water runoff can be achieved over conventional methods. Furthermore, soil erosion and water evaporation are substantially reduced.

Another advantage of the invention is the production of seedbeds in a single operation which are superior in geometric configuration and stability to those produced using the known land surface treatments. In addition, much more established root systems are obtained in soil treated in the process of the invention because of improved soil moisture conditions.

It is a particular feature of my method that it can be used in brush-covered, steeply-sloped, and deeply-gullied land. It may also be applied to land surfaces which contain rocks. It is notable that the method of the invention will mulch and maintain virtually all living and dead plant material on or imbedded in the immediate soil surface. The land imprinter also makes surface indentation patterns in which up to 5 centimeters of rain water can be diffusely and securely stored. The indentation patterns of the invention also prevent downslope movement of vegetative mulch which occurs by floatation in runoff water.

DESCRIPTION OF THE PREFERRED EMBODIMENTS

As mentioned above in the method of the invention the land surface is imprinted with two adjacent geometric patterns. One geometric pattern enhances water infiltration into the land surface. The other geometric pattern collects and directs water runoff to the water-infiltration-enhancing geometric pattern area adjacent to it.

Generally, the water-runoff-directing geometric pattern is perpendicularly disposed with respect to the water-infiltration-enhancing geometry. However, other orientations of the two patterns are possible as long as water runoff is directed to and interconnects with the water-infiltrating area.

The water-infiltration-enhancing geometric patterns may take the form of a plurality of closely-spaced open-pocket-like indentations. Preferably, the indentations possess some connecting means for allowing water to pass therebetween. For example, a plurality of small, short-length intrafurrows or soil indentations can be employed for the above purpose. The open-pocket-like indentations should be approximately 5 to 15 cm. deep, 15 to 30 cm. wide, and 25 to 100 cm. long.

The water-infiltration-enhancing geometric patterns are usually about from 0.5 to 2 meters in width and alternate with the water-runoff-directing geometric patterns. In general, there are about four rows of indentations per one meter-wide strip. Short-length intrafurrows or soil indentations, which provide means for water to pass between furrows, can be spaced from about 25 to 100 cm apart.

Figure 1:
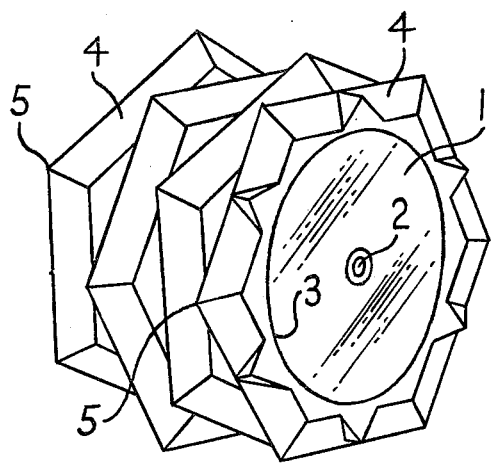
FIGS. 1–7 are perspective views of imprint capsules, by way of illustration and not limitation, capable of producing water infiltration-enhancing geometric patterns in accordance with the instant invention.
Figure 2:
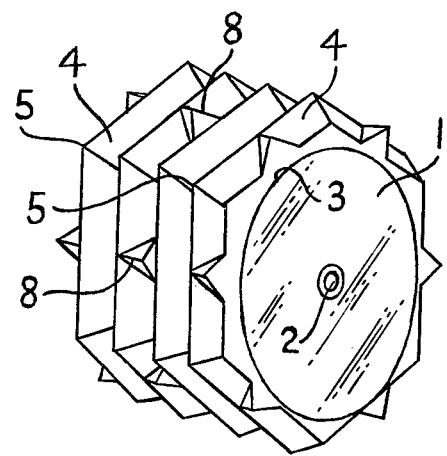
Figure 3:
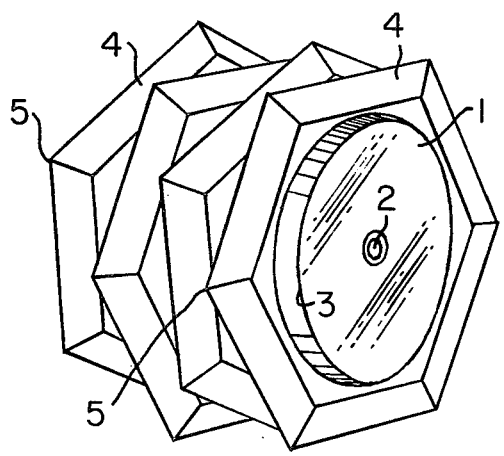
Figure 4:
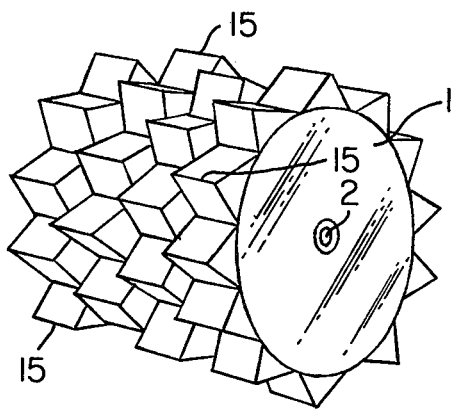
Figure 5:
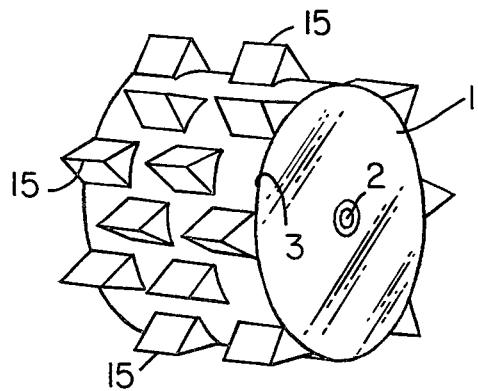
Figure 6:
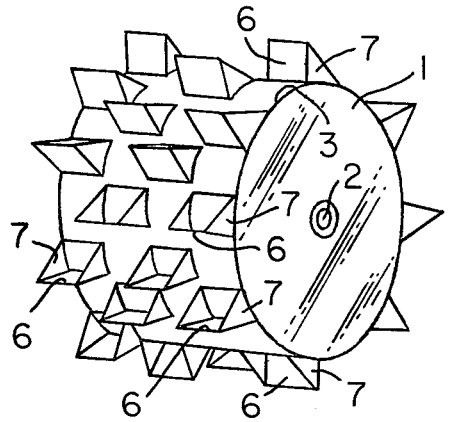
Figure 7:
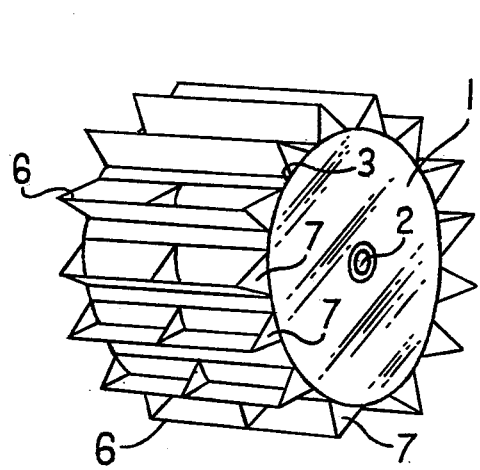

Typical water-infiltration-enhancing geometries, by way of illustration and not limitation, are shown in the imprint capsules in FIGS. 1–7. Referring to FIG. 1, numeral 1 designates a cylindrical core with cylindrical opening 2 passing therethrough. On the surface 3 of 1 are imprint structures 4 with tips 5 for forming open-pocket-like indentations in the soil. FIG. 7 represents another example of an imprint capsule in accordance with the invention wherein the numeral 6 designates imprint structures and wherein open-pocket-like indentations are formed as a result of ribs 6 and side pieces 7. FIG. 2 depicts an imprint capsule containing short-length intrafurrows 8 to facilitate movement of water within the water-infiltration area.

Imprint capsules such as those in FIGS. 1–7 are usually formulated of steel or other suitable metal, concrete, and the like. The weight of an imprint capsule in accordance with the invention should be about from 0.5 to 2.0 metric tons. The diameter of the cylindrical core is about from 1 to 2 meters and its length is about from 1 to 2 meters.

The water-runoff-directing geometric patterns may take the form of a plurality of short-length, shallow furrows which may be perpendicularly-disposed to the water-infiltration-enhancing geometric pattern. Generally, the length of any particular furrow will be about from 0.5 to 2 meters with a depth of about 5 to 15 cm. and a width of about 15 to 30 cm. The furrows forming the water-infiltration-enhancing geometry can be spaced from about 25 to 50 cm. apart.

Figure 8:
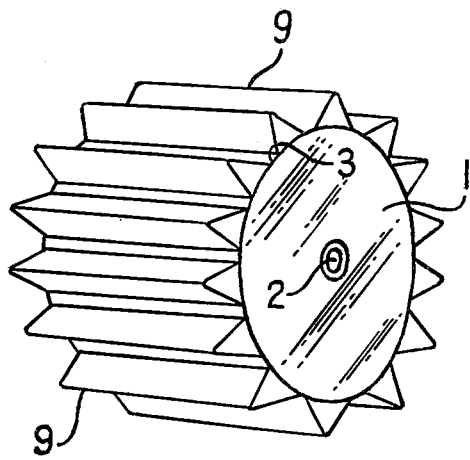
FIGS. 8 and 9 are perspective views of imprint capsules, by way of illustration and not limitation, capable of producing water runoff-directing geometric patterns in accordance with the instant invention.
Figure 9:
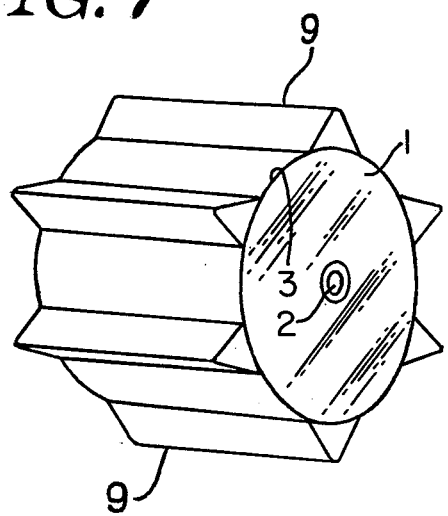

Typical imprint capsules possessing water-runoff-directing geometries in accordance with the invention are shown in FIGS. 8 and 9. In FIGS. 8 and 9, cylindrical core 1 is fitted on its surface 3 with shallow-furrow-forming imprint structures 9. Generally, the imprint capsules in FIGS. 8 and 9 differ from those in FIGS. 1–7 only by the imprint geometric patterns on their surfaces.

Figure 10:
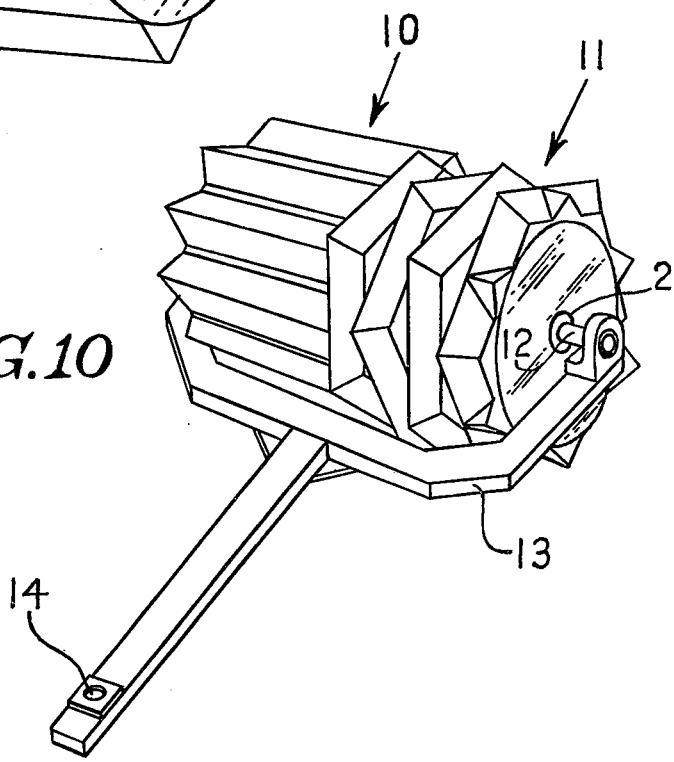
FIG. 10 is a perspective view of an apparatus in accordance with the instant invention depicting, by way of illustration and not limitation, the conjunctive use of imprint capsules capable of producing water infiltration-enhancing and runoff-directing geometric patterns.

An apparatus (FIG. 10) for carrying out the method of the invention can be prepared then by pairing an imprint capsule with a water-infiltration-enhancing geometry (11) and an imprint capsule with a water-runoff directing geometry (10). The imprinting capsules are placed side-by-side and axle 12 is passed through cylindrical openings 2. The capsules and axle are clamped together to form a compound roller-and-axle assembly. The axle is affixed to frame 13 which can be attached to a tractor or other device by means of hitch receiver 14 to provide mobility for the apparatus of the invention. Alternatively, paired imprint capsules as described above can be incorporated into a device which is self-contained and self-propelled. In another alternative embodiment, a single cylindrical core may be fitted on its surface with both a water-runoff-directing geometry and a water-infiltration-enhancing geometry. Ratios of surface areas covered with these geometries will range from about 0.5 to 2.0.

The apparatus of the invention is conveyed over the soil to be imprinted in such a way as to yield alternating but adjacent water-runoff-directing and water-infiltration-enhancing geometric patterns in the soil. It is within the compass of the invention to have more than one pair of imprint capsules constituting the apparatus of the invention. In this way fewer number of passes need be made to imprint a specific area of land and a greater diversity of geometric patterns can be imprinted simultaneously.

The type of geometric design chosen in the imprint capsules in any particular instance is dependent upon soil and vegetative conditions, land topography, tillage objectives, climatic conditions, and the like. Thus, the selection of the imprint geometry is governed by such factors as the moisture content of the soil, the presence of rocks or brush on the surfac of the soil, the purposes of the tillage, such as formation of seedbeds, rain water irrigation of crop plants, prevention of soil erosion, etc., and so forth.

As pointed out above, the method and apparatus of the invention yield excellent seedbeds. The open-pocket-like indentations in the water-infiltration-enhancing area provide a depository in which a seed may be placed and may germinate and grow. The growth will be accompanied by a well-established root system nurtured by the water received from the water-runoff-directing area.

Having thus described my invention, I claim:

1. A method for modifying a land surface to control water runoff collection, direction, and infiltration, which comprises imprinting the land surface with alternating—
    water-runoff-directing geometric patterns comprising a plurality of parallel furrows about 0.5 to 2 meters in length, about 5 to 15 centimeters in depth, and about 15 to 30 centimeters in width, and spaced about 25 to 50 centimeters apart, which collect and direct runoff water to
    adjacent water-infiltration-enhancing geometric patterns arranged in rows and comprising a plurality of quadrilateral pyramidal indentations about 25 to 100 centimeters in length, 5 to 15 centimeters in depth, and 15 to 30 centimeters in width,
    said rows of water-infiltration-enhancing geometric patterns being oriented perpendicularly and transversely to and interconnected with said adjacent water-runoff-directing geometric patterns in order to receive the collected and directed runoff water.

2. The method of claim 1 wherein the alternating water-runoff-directing geometric patterns and the water-infiltration-enhancing geometric patterns are each about 0.5 to 2 meters in width.

3. The method of claim 1 wherein the water-runoff-directing geometric patterns comprise a plurality of short-length, shallow furrows.

4. The method of claim 3 wherein the furrows are about 0.5 to 2 meters in length, about 5 to 15 cm. in depth, and about 15 to 30 cm. in width.

5. The method of claim 1 wherein the water-infiltration-enhancing geometric patterns comprise a plurality of closely-spaced open-pocket-like indentations.

6. The method of claim 5 wherein the indentations are about 25 to 100 cm. in length, about 5 to 15 cm. in depth, and about 15 to 30 cm. in width.

7. The method of claim 5 wherein the water-infiltration-enhancing geometric patterns further comprise a plurality of intrafurrows connecting the open-pocket-like indentations.

8. The method of claim 1 wherein the water-runoff-directing geometric patterns are perpendicularly disposed to the water-infiltration-enhancing geometric patterns.

9. An apparatus for modifying land surfaces to control water runoff collection, direction, and infiltration which comprises—
 (a) a frame,
 (b) means for imprinting water-runoff-directing geometric patterns in the land surface rotatably mounted on said frame, said imprinting means comprising a plurality of parallel furrows producing ribs about 0.5 to 2 meters in length, about 5 to 15 centimeters in depth, and about 15 to 30 centimeters in width, and spaced about 25 to 50 centimeters apart, said furrows providing for collection and direction of runoff water, and
 (c) means for imprinting rows of water-infiltration-enhancing geometric patterns in the land surface rotatably mounted on said frame adjacent to said means for imprinting water-runoff-directing geometric patterns, said water-infiltration-enhancing geometric patterns comprising a plurality of quadrilateral pyramidal projections about 25 to 100 centimeters in length, 5 to 15 centimeters in height, and 15 to 30 centimeters in width,
 said rows of water-infiltration-enhancing geometric patterns being oriented perpendicularly and transversely to said adjacent water-runoff-directing geometric patterns and interconnected therewith in order to receive the collected and directed runoff water.

* * * * *